United States Patent
Matsueda et al.

(10) Patent No.: US 11,798,446 B2
(45) Date of Patent: Oct. 24, 2023

(54) DISPLAY DEVICE AND TERMINAL DEVICE

(71) Applicant: WUHAN TIANMA MICRO-ELECTRONICS CO., LTD., Wuhan (CN)

(72) Inventors: Yojiro Matsueda, Kanagawa (JP); Masamichi Shimoda, Kanagawa (JP)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/380,120

(22) Filed: Jul. 20, 2021

(65) Prior Publication Data

US 2022/0028311 A1    Jan. 27, 2022

(30) Foreign Application Priority Data

Jul. 22, 2020 (JP) .................. 2020-125352

(51) Int. Cl.
*G09G 3/3233* (2016.01)
*G09G 3/00* (2006.01)
(Continued)

(52) U.S. Cl.
CPC .......... *G09G 3/006* (2013.01); *G06F 3/0446* (2019.05); *G09G 3/3233* (2013.01); *H10K 59/126* (2023.02); *H10K 59/40* (2023.02); *G06F 2203/04111* (2013.01); *G09G 2300/0413* (2013.01); *G09G 2300/0426* (2013.01); *G09G 2300/0452* (2013.01);
(Continued)

(58) Field of Classification Search
CPC ............... G09G 3/006; G09G 3/3233; G09G 2300/0413; G09G 2300/0426; G09G 2300/0452; G09G 2300/0842; G09G 2310/08; G09G 2320/029; G09G 2320/045; G09G 2330/12; G09G 2310/0297; G09G 2320/0233; G09G 2320/0626; G06F 3/0446; G06F 2203/04111; H10K 59/126; H10K 59/40; H10K 59/131; H10K 59/88; H10K 59/12
See application file for complete search history.

(56) References Cited

U.S. PATENT DOCUMENTS 8,497,857 B2 *  7/2013  Nakamura ........... G09G 3/3291
                                                   345/204
2005/0030214 A1   2/2005  Jo
(Continued)

*Primary Examiner* — Jose R Soto Lopez
(74) *Attorney, Agent, or Firm* — NIXON & VANDERHYE

(57) ABSTRACT

A display device includes a display region including display pixels, dummy pixels disposed outside the display region, light blocking films covering the dummy pixels. The display region includes a first region and a second region having a lower display pixel density than the first region. A control circuit is configured to supply the display pixels in the second region with driving current higher than driving current for the first region for the same grayscale level specified in image data, supply each of the dummy pixels with the same data signal as a data signal for the associated display pixel in the second region, measure deterioration of the light-emitting element of each of the dummy pixels, and adjust data signals for the display pixels in the second region associated with the dummy pixels based on results of the measurement.

7 Claims, 12 Drawing Sheets

(51) Int. Cl.
  *G06F 3/044* (2006.01)
  *H10K 59/40* (2023.01)
  *H10K 59/126* (2023.01)

(52) U.S. Cl.
  CPC . *G09G 2300/0842* (2013.01); *G09G 2310/08* (2013.01); *G09G 2320/029* (2013.01); *G09G 2320/045* (2013.01); *G09G 2330/12* (2013.01)

(56) References Cited

U.S. PATENT DOCUMENTS

| | | | |
|---|---|---|---|
| 2007/0236431 A1* | 10/2007 | Tada | G09G 3/3208 345/84 |
| 2011/0248975 A1* | 10/2011 | Takuma | G09G 3/3225 345/207 |
| 2014/0098304 A1* | 4/2014 | Kim | G06F 3/0443 349/12 |
| 2016/0027378 A1* | 1/2016 | Kim | G02B 6/0055 345/207 |
| 2016/0093251 A1* | 3/2016 | Chung | G09G 3/3275 345/207 |
| 2016/0140898 A1* | 5/2016 | Hyun | G09G 3/3233 345/694 |
| 2016/0189620 A1* | 6/2016 | Park | G09G 3/2022 345/76 |
| 2017/0270855 A1* | 9/2017 | Maeda | G09G 3/3233 |
| 2017/0365205 A1* | 12/2017 | Kishi | G01R 19/10 |
| 2018/0182816 A1 | 6/2018 | Kang et al. | |
| 2018/0357952 A1 | 12/2018 | Yang | |
| 2019/0073961 A1* | 3/2019 | Park | G09G 3/2092 |
| 2020/0234634 A1* | 7/2020 | Li | G09G 3/3208 |
| 2021/0020719 A1* | 1/2021 | Abe | H10K 59/88 |
| 2021/0201825 A1* | 7/2021 | Yun | G09G 3/3225 |
| 2021/0202629 A1* | 7/2021 | Myung | G09G 3/3258 |
| 2022/0037422 A1* | 2/2022 | Zhang | G09G 3/2003 |

* cited by examiner

DISPLAY DEVICE AND TERMINAL DEVICE

CROSS-REFERENCE TO RELATED APPLICATIONS

This non-provisional application claims priority under 35 U.S.C. § 119(a) on Patent Application No. 2020-125352 filed in Japan on Jul. 22, 2020, the entire content of which is hereby incorporated by reference.

BACKGROUND

This disclosure relates to a display device and a terminal device.

An organic light-emitting diode (OLED) element is a current-driven self-light-emitting element and therefore, does not need a backlight. In addition to this, the OLED element has advantages for achievement of low power consumption, wide viewing angle, and high contrast ratio; it is expected to contribute to development of flat panel display devices.

The display region of an OLED display device can include a region having a pixel density different from the other region. For example, some portable terminals like smartphones and tablet computers include a camera for taking a picture under the display region. For the camera to receive external light, the camera is disposed under a region having a pixel density lower than the surroundings.

SUMMARY

An aspect of this disclosure is a display device including: a display region including a plurality of display pixels, the display region being configured to display an image in accordance with image data input from an external device; a plurality of dummy pixels disposed outside the display region; one or more light blocking films covering the plurality of dummy pixels on the side to be viewed; and a control circuit configured to control the display region and the plurality of dummy pixels. The display region includes: a first region; and a second region having a lower display pixel density than the first region. Each of the plurality of dummy pixels is associated with a display pixel disposed in the second region. Each of the plurality of display pixel and the plurality of dummy pixels includes a light-emitting element that emits light in response to driving current. The control circuit is configured to: supply the display pixels in the second region with driving current higher than driving current for the display pixels in the first region for a same grayscale level specified in image data; supply each of the plurality of dummy pixels with a same data signal as a data signal for the associated display pixel in the second region; measure deterioration of the light-emitting element of each of the plurality of dummy pixels; and adjust data signals for the display pixels in the second region associated with the plurality of dummy pixels based on results of the measurement.

It is to be understood that both the foregoing general description and the following detailed description are exemplary and explanatory and are not restrictive of this disclosure.

EMBODIMENTS

Figure 1:
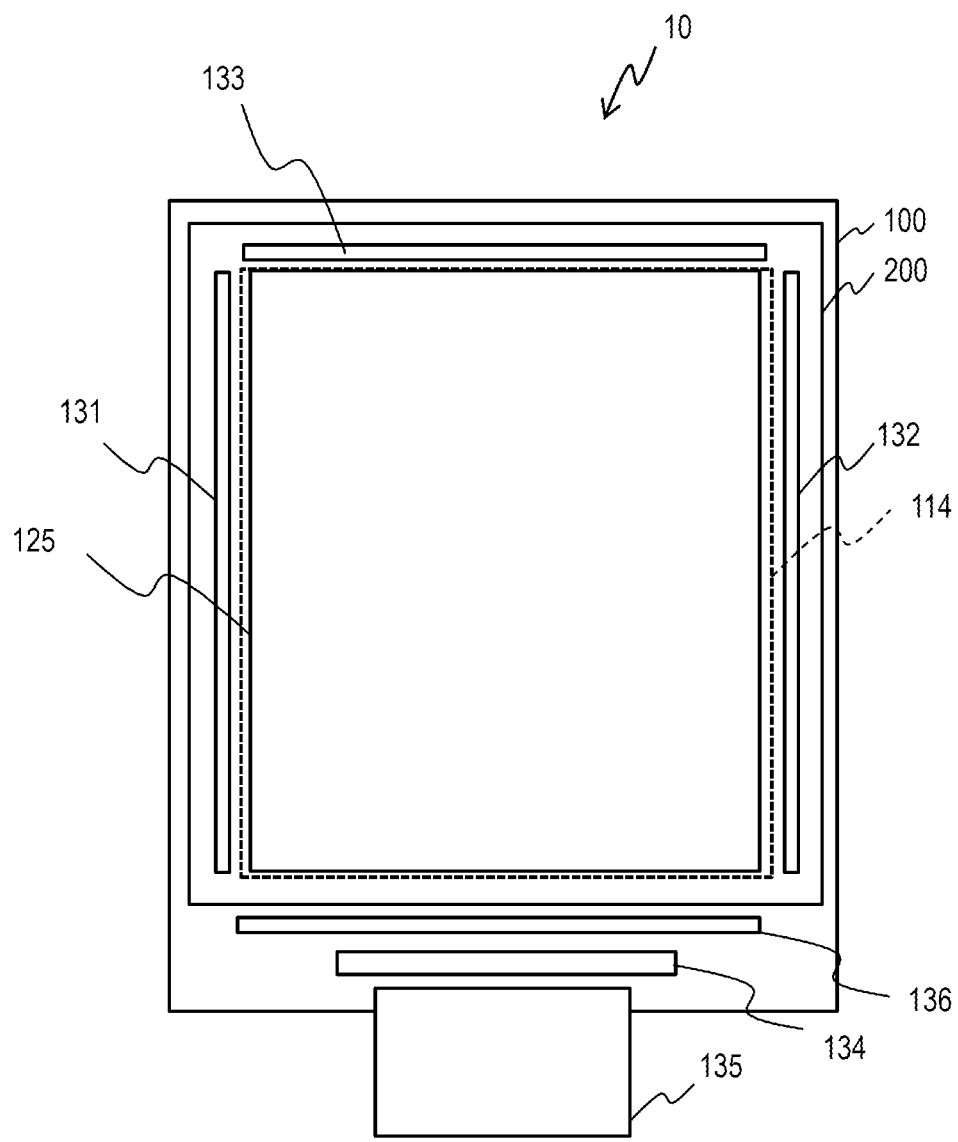
FIG. 1 schematically illustrates a configuration example of an OLED display device.

Hereinafter, embodiments of this disclosure will be described with reference to the accompanying drawings. It should be noted that the embodiments are merely examples to implement this disclosure and not to limit the technical scope of this disclosure.

In the following description, a pixel is the smallest unit in the display region and an element for emitting light of a single color. It is also referred to as subpixel. A set of pixels of different colors (red, blue, and green, for example) constitute an element for displaying one mixed-color dot. This element can be referred to as main pixel. When the element for emitting light of a single color needs to be distinguished from the element for emitting light of a mixed color for clarity of description, the former is referred to as subpixel and the latter as main pixel. The features of this description are applicable to monochrome display devices whose display region is composed of monochrome pixels.

A configuration example of a display device is described. The display region of the display device includes a second region (also referred to as low-density region) having a relatively low pixel density and a first region (also referred to as normal region) having a relatively high pixel density. To minimize the degradation in display quality of an image in the display region, the pixels in the low-density region are controlled to light brighter than the pixels in the normal region for the same grayscale level specified in image data. The display region can include a plurality of low-density regions where the pixel density is lower than the normal region and these low-density regions can have different pixel densities.

The light-emitting element of a pixel in the examples described in the following is a current-driven element, such as organic light-emitting diode (OLED) element. Accordingly, the pixels in a low-density region are supplied with higher current than the pixels in a normal region for the same grayscale level specified in image data. For this reason, the pixels in the low-density region deteriorate faster than the pixels in the normal region. Each pixel deteriorates as the display time increases. The display device can estimate the deterioration of each pixel and adjust its brightness depending on the estimation. However, when the deterioration progresses faster, accurate estimation of the deterioration becomes more difficult; the accuracy of the adjustment might be lowered.

The display device described in the following includes dummy pixels disposed outside the display region. The dummy pixels are associated with the pixels in the low-density region and controlled to light at the same brightness as the associated pixels. The dummy pixels are covered with a light blocking film on the side to be viewed. This configuration prevents the dummy pixels from being seen by the user.

The dummy pixels are pixels for deterioration measurement. The display device measures the extents of deterioration of the light-emitting elements of the dummy pixels and feeds back the measurement results to the brightness adjustment control for the associated pixels in the low-density region. Measuring the deterioration of the dummy pixels not involved in displaying images contributes to appropriate brightness adjustment for the pixels in the low-density region without interfering with displaying images.

Configuration of Display Device

An overall configuration of the display device in the embodiments is described with reference to FIG. 1. The elements in the drawings may be exaggerated in size or shape for clear understanding of the description. In the following, an organic light-emitting diode (OLED) display device is described as an example of the display device.

FIG. 1 schematically illustrates a configuration example of an OLED display device 10. The OLED display device 10 includes a thin-film transistor (TFT) substrate 100 on which OLED elements (light-emitting elements) are fabricated and a structural encapsulation unit 200 for encapsulating the OLED elements. In the periphery of a cathode electrode region 114 outer than the display region 125 of the TFT substrate 100, control circuits, specifically a scanning driver 131, an emission driver 132, an electrostatic discharge protection circuit 133, a driver IC 134, and a demultiplexer 136, are provided.

The driver IC 134 is connected to the external devices via flexible printed circuits (FPC) 135. The scanning driver 131 drives scanning lines on the TFT substrate 100. The emission driver 132 drives emission control lines to control the light emission of pixels. The electrostatic discharge protection circuit 133 saves the elements on the TFT substrate 100 from electrostatic discharge damage. The driver IC 134 is mounted with an anisotropic conductive film (ACF), for example.

The driver IC 134 provides power and control signals including a timing signal to the scanning driver 131 and the emission driver 132 and further, provides power and a data signal to the demultiplexer 136. The demultiplexer 136 outputs output of one pin of the driver IC 134 to d data lines (d is an integer greater than 1) in series. The demultiplexer 136 changes the output data line for the data signal from the driver IC 134 d times per scanning period to drive d times as many data lines as output pins of the driver IC 134.

Configuration of Pixel Circuit

Figure 2A:
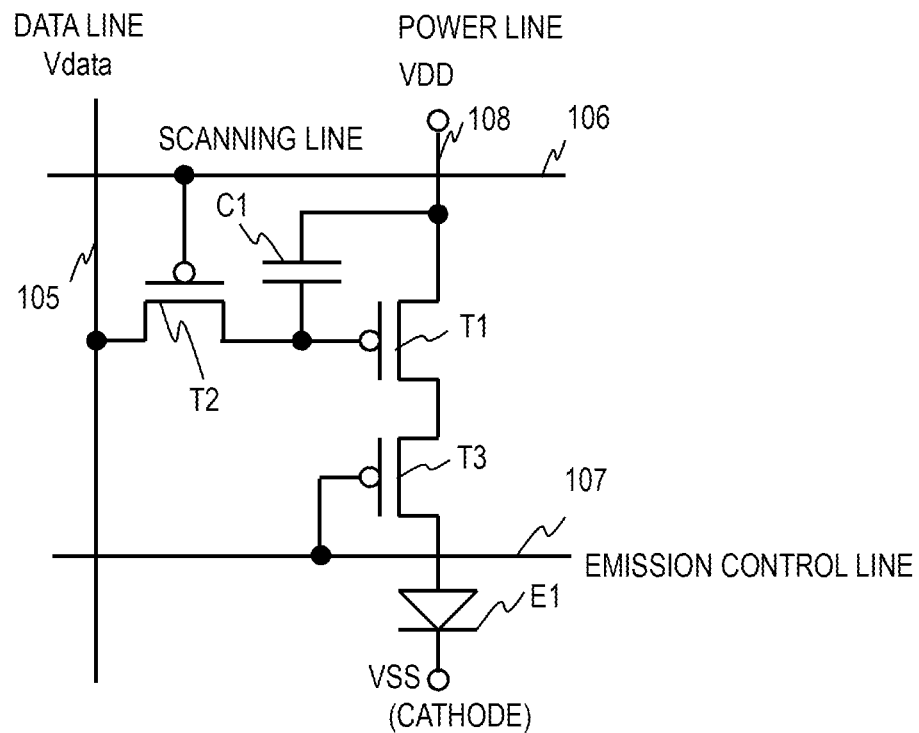
FIG. 2A illustrates a configuration example of a pixel circuit.

A plurality of pixel circuits are fabricated on the TFT substrate 100 to control electric current to be supplied to the anode electrodes of subpixels FIG. 2A illustrates a configuration example of a pixel circuit. Each pixel circuit includes a driving transistor T1, a selection transistor T2, an emission transistor T3, and a storage capacitor C1. The pixel circuit controls light emission of an OLED element E1. The transistors are TFTs.

The selection transistor T2 is a switch for selecting the subpixel. The selection transistor T2 is a p-channel TFT and its gate terminal is connected with a scanning line 106. The source terminal is connected with a data line 105. The drain terminal is connected with the gate terminal of the driving transistor T1.

The driving transistor T1 is a transistor (driving TFT) for driving the OLED element E1. The driving transistor T1 is a p-channel TFT and its gate terminal is connected with the drain terminal of the selection transistor T2. The source terminal of the driving transistor T1 is connected with a power line 108 for transmitting a power supply potential VDD. The drain terminal is connected with the source terminal of the emission transistor T3. The storage capacitor C1 is provided between the gate terminal and the source terminal of the driving transistor T1.

The emission transistor T3 is a switch for controlling supply/stop of the driving current to the OLED element E1. The emission transistor T3 is a p-channel TFT and its gate terminal is connected with an emission control line 107. The source terminal of the emission transistor T3 is connected with the drain terminal of the driving transistor T1. The drain terminal of the emission transistor T3 is connected with the OLED element E1. The cathode of the OLED element E1 is supplied with a cathode power supply potential VSS.

Next, operation of the pixel circuit is described. The scanning driver 131 outputs a selection pulse to the scanning line 106 to turn on the transistor T2. The data voltage supplied from the driver IC 134 through the data line 105 is stored to the storage capacitor C1. The storage capacitor C1 holds the stored voltage during the period of one frame. The conductance of the driving transistor T1 changes in an analog manner in accordance with the stored voltage, so that the driving transistor T1 supplies a forward bias current corresponding to a light emission level to the OLED element E1.

The emission transistor T3 is located on the supply path of the driving current. The emission driver 132 outputs a control signal to the emission control line 107 to control ON/OFF of the emission transistor T3. When the emission transistor T3 is ON, the driving current is supplied to the OLED element E1. When the emission transistor T3 is OFF, this supply is stopped. The lighting period (duty ratio) in the period of one frame can be controlled by controlling ON/OFF of the emission transistor T3.

Figure 2B:
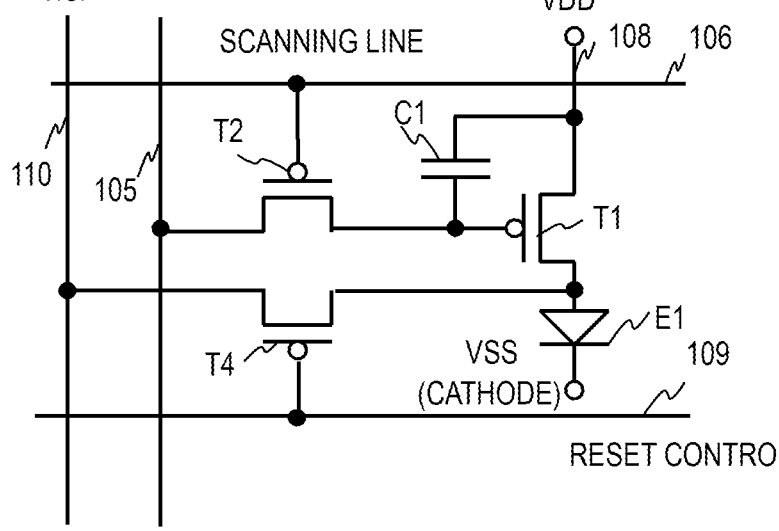
FIG. 2B illustrates another configuration example of a pixel circuit.

FIG. 2B illustrates another configuration example of a pixel circuit. This pixel circuit includes a reset transistor T4 in place of the emission transistor T3 in FIG. 2A. The reset transistor T4 controls the electric connection between a reference voltage supply line 110 and the anode of the OLED element E1. This control is performed in accordance with a reset control signal supplied to the gate of the reset transistor T4 through a reset control line 109.

The reset transistor T4 can be used for various purposes. For example, the reset transistor T4 can be used to reset the anode electrode of the OLED element E1 once to a sufficiently low voltage that is lower than the black signal level to prevent crosstalk caused by leak current between OLED elements E1.

The circuit configurations in FIGS. 2A and 2B are examples; the pixel circuit may have a different circuit configuration. Although the pixel circuits in FIGS. 2A and 2B include p-channel TFTs, the pixel circuit may employ n-channel TFTs.

Cross-Sectional Structure of OLED Display Device

Figure 3:
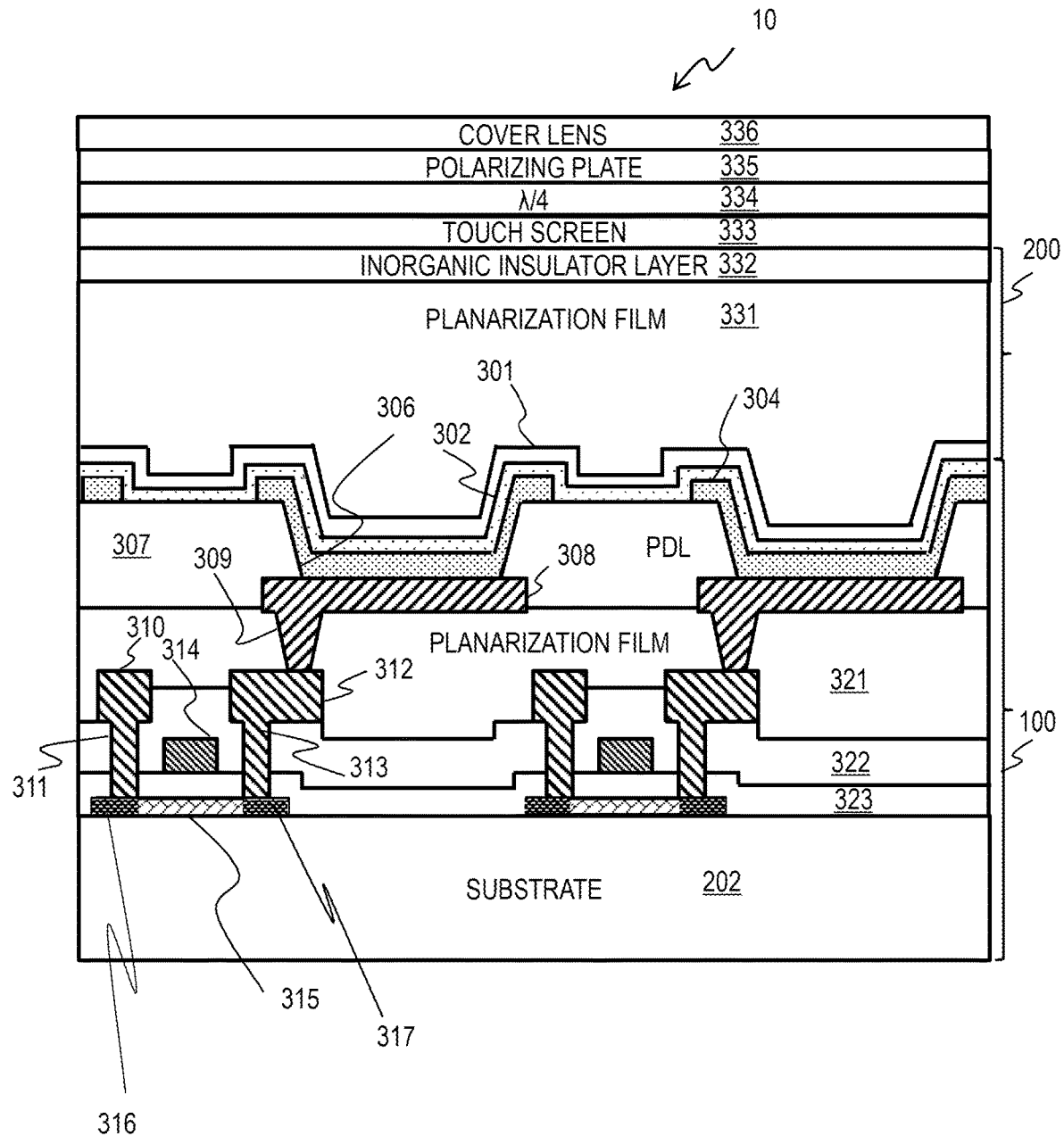
FIG. 3 schematically illustrates a cross-sectional structure of the substrate, driving TFTs, and OLED elements of a TFT substrate and an structural encapsulation unit.

Hereinafter, the structure of an OLED display device is described. FIG. 3 schematically illustrates a cross-sectional structure of the substrate, driving TFTs, and OLED elements of the TFT substrate 100 and the structural encapsulation unit 200. The substrate is a flexible substrate but can be a rigid substrate. In the following description, the definitions of top and bottom correspond to the top and the bottom of the drawing. The structural encapsulation unit 200 can be an encapsulation substrate.

An OLED display device 10 includes a TFT substrate 100 and a structural encapsulation unit 200. The TFT substrate 100 includes a substrate 202, and pixel circuits (a TFT array) and OLED elements fabricated on the substrate 202. The pixel circuits and the OLED elements are provided between the substrate 202 and the structural encapsulation unit 200.

The substrate 202 is a flexible substrate composed of a plurality of layers including an organic layer (for example, a polyimide layer) and an inorganic layer (for example, a silicon oxide layer or a silicon nitride layer). The pixel circuits (TFT array) and the OLED elements are fabricated on the substrate 202. An OLED element includes a lower electrode (for example, an anode electrode 308), an upper electrode (for example, a cathode electrode 302), and a multilayer organic light-emitting film 304. The multilayer organic light-emitting film 304 is located between the cathode electrode 302 and the anode electrode 308. A plurality of anode electrodes 308 are disposed on the same plane (for example, on a planarization film 321); one multilayer organic light-emitting film 304 is disposed above one anode electrode 308. In the example of FIG. 3, the cathode electrode 302 of one subpixel is a part of an unseparated conductor film.

Illustrated in FIG. 3 is an example of a top-emission pixel structure, which includes top-emission type of OLED elements. The top-emission pixel structure is configured in such a manner that a cathode electrode 302 common to a plurality of pixels is provided on the light emission side (the side to be viewed and the upper side of the drawing). The cathode electrode 302 has a shape that fully covers the entire display region 125. The top-emission pixel structure is characterized by that the anode electrodes 308 have light reflectivity and the cathode electrode 302 has light transmissivity. Hence, a configuration to transmit light coming from the multilayer organic light-emitting films 304 toward the structural encapsulation unit 200 is attained.

Compared to a bottom-emission pixel structure configured to extract light toward the substrate 202, the top-emission type does not need a light transmissive region within a pixel region to extract light. For this reason, the top-emission type has high flexibility in laying out pixel circuits. For example, the light-emitting regions can be provided above the pixel circuits or lines.

The bottom-emission pixel structure has a transparent anode electrode and a reflective cathode electrode to emit light to the external through the substrate (from the side to be viewed). If both the anode electrode and the cathode electrode are made of light transmissive materials, a transparent display device can be obtained. The structure of the flexible substrate of this disclosure is applicable to OLED display devices of any of these types and further, display devices including light-emitting elements other than OLEDs.

A subpixel of a full-color OLED display device usually lights in one of the colors of red, green, and blue. A red subpixel, a green subpixel, and a blue subpixel constitute one main pixel. A pixel circuit including a plurality of thin-film transistors controls light emission of an OLED element associated therewith. An OLED element is composed of an anode electrode as a lower electrode, an organic light-emitting film, and a cathode electrode as an upper electrode.

An OLED display device includes a plurality of pixel circuits (a TFT array). Each of the pixel circuits includes a plurality of switches; it is formed between the substrate 202 and an anode electrode 308 to control the electric current to be supplied to the anode electrode 308. The driving TFTs in FIG. 3 have a top-gate structure. The other TFTs also have the top-gate structure.

A polysilicon layer is provided above the substrate 202. The polysilicon layer includes channels 315 at the locations where gate electrodes 314 are to be formed later. The characteristics of a TFT is determined by the channel 315. At both ends of each channel 315, source/drain regions 316 and 317 are provided. The source/drain regions 316 and 317 are doped with high-concentration impurities for electrical connection with a wiring layer thereabove.

Lightly doped drains (LDDs) doped with low-concentration impurities can be provided between the channel 315 and the source/drain region 316 and between the channel 315 and the source/drain region 317. FIG. 3 omits the LDDs to avoid complexity. Above the polysilicon layer, gate electrodes 314 are provided with a gate insulating film 323 interposed therebetween. An interlayer insulating film 322 is provided above the layer of the gate electrodes 314.

Within the display region 125, source/drain electrodes 310 and 312 are provided above the interlayer insulating film 322. Each source/drain electrode 310 and each source/drain electrode 312 are connected with a source/drain region 316 and a source/drain region 317 of the polysilicon layer through contact holes 311 and 313 provided in the interlayer insulating film 322 and the gate insulating film 323.

Over the source/drain electrodes 310 and 312, an insulative organic planarization film 321 is provided. Above the planarization film 321, anode electrodes 308 are provided. Each anode electrode 308 is connected with a source/drain electrode 312 through a contact hole 309 in the planarization film 321. The TFTs of a pixel circuit are formed below the anode electrode 308.

An anode electrode 308 can be composed of a reflective metal layer in the middle and transparent conductive layers sandwiching the reflective metal layer. Above the anode electrodes 308, an insulative pixel defining layer (PDL) 307 is provided to separate OLED elements. OLED elements are formed in openings 306 of the pixel defining layer 307.

Above each anode electrode 308, a multilayer organic light-emitting film 304 is provided. The multilayer organic light-emitting film 304 is in contact with the pixel defining layer 307 in the opening 306 of the pixel defining layer 307 and its periphery. Each multilayer organic light-emitting film 304 is formed by depositing organic light-emitting material for the color of R, G, or B on an anode electrode 308.

A multilayer organic light-emitting film 304 is formed by vapor deposition of organic light-emitting material in the region corresponding to a pixel through a metal mask. A multilayer organic light-emitting film 304 consists of, for example, a hole injection layer, a hole transport layer, a light-emitting layer, an electron transport layer, and an electron injection layer in this order from the bottom. The layered structure of the multilayer organic light-emitting film 304 is determined depending on the design.

A cathode electrode 302 is provided over the multilayer organic light-emitting film 304. The cathode electrode 302 is a light-transmissive electrode. The cathode electrode 302 transmits part of the visible light coming from the multilayer organic light-emitting film 304. The layer of the cathode electrode 302 is formed by vapor-deposition of a metal such as Al or Mg or an alloy thereof. If the resistance of the cathode electrode 302 is so high to impair the uniformity of the brightness of emitted light, an additional auxiliary electrode layer may be formed using a material for a transparent electrode, such as ITO or IZO.

The stack of the anode electrode 308, the multilayer organic light-emitting film 304, and the cathode electrode 302 formed in an opening 306 of the pixel defining layer 307 corresponds to an OLED element. A structural encapsulation unit 200 is provided above and in direct contact with the cathode electrode 302. The structural encapsulation unit (thin-film encapsulation unit) 200 includes an inorganic insulator layer 301, an organic planarization film 331, and another inorganic insulator layer 332. The inorganic insulator layers 301 and 332 are a lower passivation layer and an upper passivation layer for enhancing the reliability.

A touch screen 333, a λ/4 plate 334, a polarizing plate 335, and a resin cover lens 336 are laid in this order toward the top, on the structural encapsulation unit 200. The λ/4 plate 334 and the polarizing plate 335 are to reduce the reflection of the light coming from the external. The layered structure of the OLED display device described with reference to FIG. 3 is an example; one or more of the layers in FIG. 3 may be omitted and one or more layers not shown in FIG. 3 may be added. Instead of depositing a touch screen on the TFT substrate 100, a touch screen manufactured in a process independent from the process for the TFT substrate 100 can be bonded to the TFT substrate 100 with proper alignment.

Layout of Dummy Pixels

Figure 4:
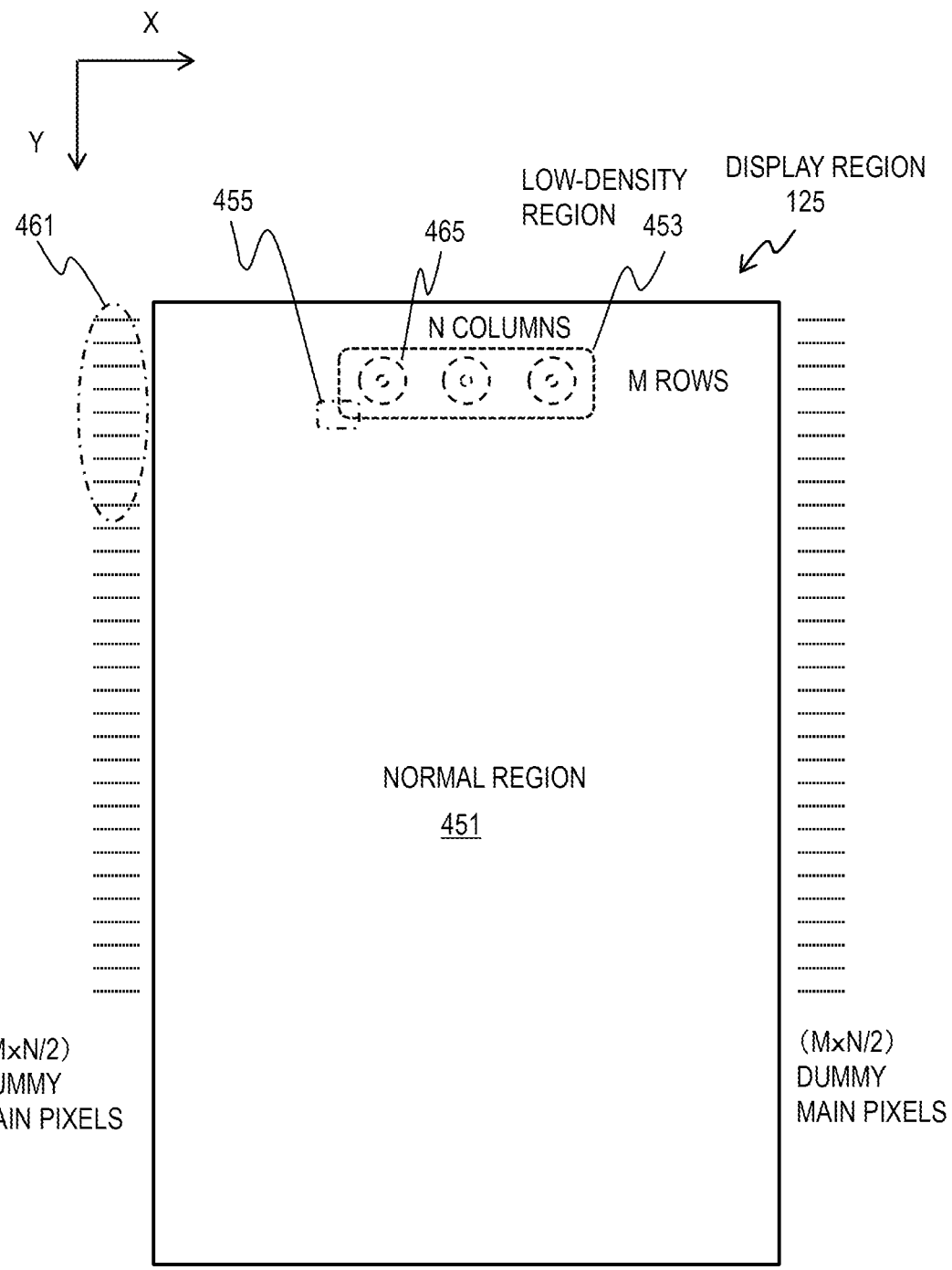
FIG. 4 schematically illustrates a display region and dummy pixels disposed outside the display region.

FIG. 4 schematically illustrates a display region 125 and dummy pixels disposed outside the display region. The OLED display device 10 can be mounted on a mobile terminal. The display region 125 includes a normal region 451 having a normal pixel density and a low-density region 453 having a pixel density lower than the pixel density of the normal region 451. One or more cameras 465 are provided under the low-density region 453. In FIG. 4, one of the plurality of cameras is provided with a reference sign 465 by way of example. In the following description, the subpixel or main pixel in the display region 125 can be referred to as display subpixel or display main pixel.

When viewing the display region 125, the cameras 465 are located behind the low-density region 453; each camera 465 takes a picture of an object in front of the camera with light transmitted through the low-density region 453. Not to interfere with the camera 465 taking a picture, the low-density region 453 has a lower pixel density than the surrounding normal region 451. A not-shown controller sends the data of the picture taken by the camera 465 to the OLED display device 10. Although the example of a low-density region in FIG. 4 is a region where cameras are disposed thereunder, the features of this description are applicable to display devices including a region having a relatively low pixel density for other purposes.

The low-density region 453 consists of N columns by M rows of main pixels. A main pixel column is composed of main pixels disposed in a line along the Y-axis, which is a vertical axis in FIG. 4. A main pixel row is composed of main pixels disposed in a line along the X-axis, which is a horizontal axis in FIG. 4.

As illustrated in FIG. 4, dummy pixels (dummy subpixels) are disposed outside the display region 125 of the OLED display panel. As will be described later, the dummy subpixels are used to estimate the deterioration of the associated subpixels in the low-density region 453. The driver IC 134 controls the dummy subpixels to emit light at the same brightness as the associated subpixels in the low-density region 453 and measures the deterioration of the dummy subpixels. Through this operation, the deterioration of the associated subpixels can be assessed correctly.

In the example of FIG. 4, dummy main pixels associated with the main pixels in the low-density region 453 in one-to-one correspondence are disposed outside the display region 125. In the example of FIG. 4, M columns by N/2 rows of dummy main pixels are disposed on each side of the display region 125. Dummy subpixels can be prepared for only a part of the subpixels in the low-density region 453; the layout of the dummy subpixels is not limited to the layout in FIG. 4 but can be determined as appropriate.

Figure 5:
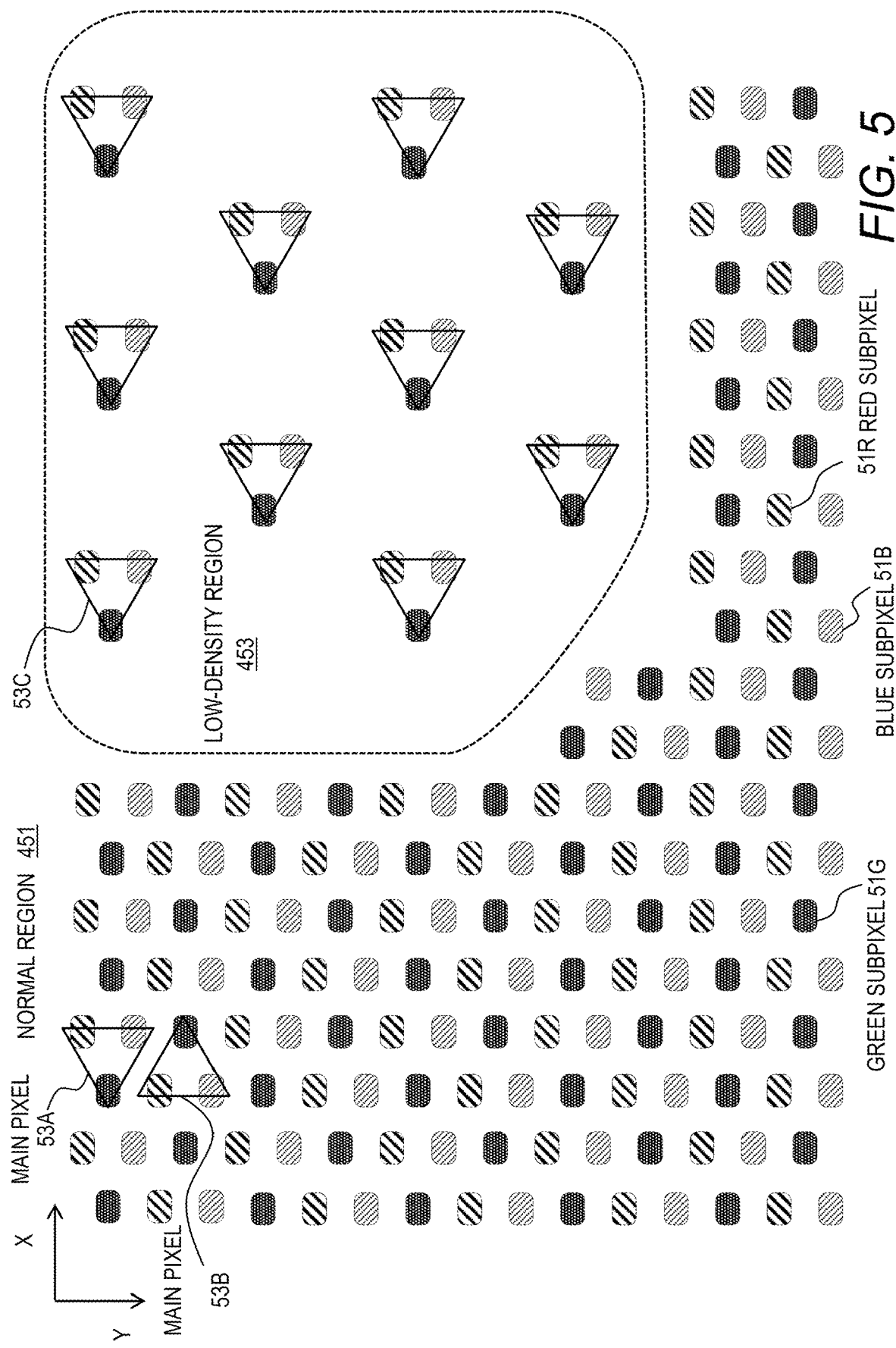
FIG. 5 illustrates the specifics of a region surrounded by a dashed-dotted line in FIG. 4.

FIG. 5 illustrates the specifics of the region 455 surrounded by a dashed-dotted line in FIG. 4. FIG. 5 illustrates a pixel layout of delta-nabla arrangement (also simply referred to as delta arrangement), but the features of this embodiment are applicable to display devices having other pixel layouts.

The region 455 is a border area between the normal region 451 and the low-density region 453. In the example of FIG. 5, the pixel density of the low-density region 453 is ¼ of the pixel density of the normal region 451. The subpixels in the low-density region 453 are controlled to emit light four times brighter than the subpixels in the normal region 451 in response to the identical image data.

The display region 125 is composed of a plurality of red subpixels 51R, a plurality of green subpixels 51G, and a plurality of blue subpixels 51B disposed in a plane. In FIG. 5, one of the red subpixels, one of the green subpixels, and one of the blue subpixels are provided with reference signs by way of example. The rounded rectangles identically hatched in FIG. 5 represent subpixels of the same color. Although the subpixels in FIG. 5 have rectangular shapes, subpixels may have desired shapes, such as hexagonal or octagonal shapes.

A subpixel column is composed of subpixels at the same X-axial position aligned along the Y-axis. In a subpixel column, red subpixels 51R, blue subpixels 51B, and green subpixels 51G are cyclically disposed. In an example, the subpixels in a subpixel column are connected with the same data line. A subpixel row is composed of subpixels of the same color at the same Y-axial position aligned along the X-axis. In an example, the subpixels in a subpixel row are connected with the same scanning line.

In the configuration example of FIG. 5, the normal region 451 includes two kinds of main pixels of first main pixels 53A and second main pixels 53B disposed in a matrix. In FIG. 5, only one of the first main pixels is provided with a reference sign 53A and only one of the second main pixels is provided with a reference sign 53B, by way of example. If subpixel rendering is employed, main pixels in the image data from the external do not coincide with the main pixels of the panel.

In FIG. 5, a first main pixel 53A is represented by a triangle such that one vertex is located on the left and the other two vertices are located on the right and a second main pixel 53B is represented by a triangle such that one vertex is located on the right and the other two vertices are located on the left.

The red subpixel 51R and the blue subpixel 51B of a first main pixel 53A are disposed consecutively in the same subpixel column. The subpixel column including the green subpixel 51G of the first main pixel 53A is adjacent to and on the left of the subpixel column including the red subpixel 51R and the blue subpixel 51B. The green subpixel 51G is located at the midpoint between the red subpixel 51R and the blue subpixel 51B on the Y-axis.

The red subpixel 51R and the blue subpixel 51B of a second main pixel 53B are disposed consecutively in the same subpixel column. The subpixel column including the green subpixel 51G of the second main pixel 53B is adjacent to and on the right of the subpixel column including the red subpixel 51R and the blue subpixel 51B. The green subpixel 51G is at the midpoint between the red subpixel 51R and the blue subpixel 51B on the Y-axis.

The low-density region 453 is composed of main pixels 53C having the same configuration as the first main pixels 53A. FIG. 5 includes 5 columns by 4 rows of main pixels 53C. The main pixels 53C are disposed regularly; the distances between main pixels are equal along both the X-axis and the Y-axis. The main pixel rows adjacent to each other are shifted by a half pitch. The pitch is the distance between the centroids of adjacent main pixels along the X-axis.

The subpixel layout of the low-density region 453 has a configuration such that the subpixels in the layout of the normal region 451 are partially excluded. The subpixels in the low-density region 453 constitute subpixel rows and subpixel columns together with subpixels in the normal region 451. A subpixel column in the low-density region 453 and the corresponding subpixel column in the normal region 451 constitute one subpixel column and the subpixels therein are connected with the same data line. A subpixel row in the low-density region 453 and the corresponding subpixel row in the normal region 451 constitute one subpixel row and the subpixels therein are connected with the same scanning line.

Figure 6:
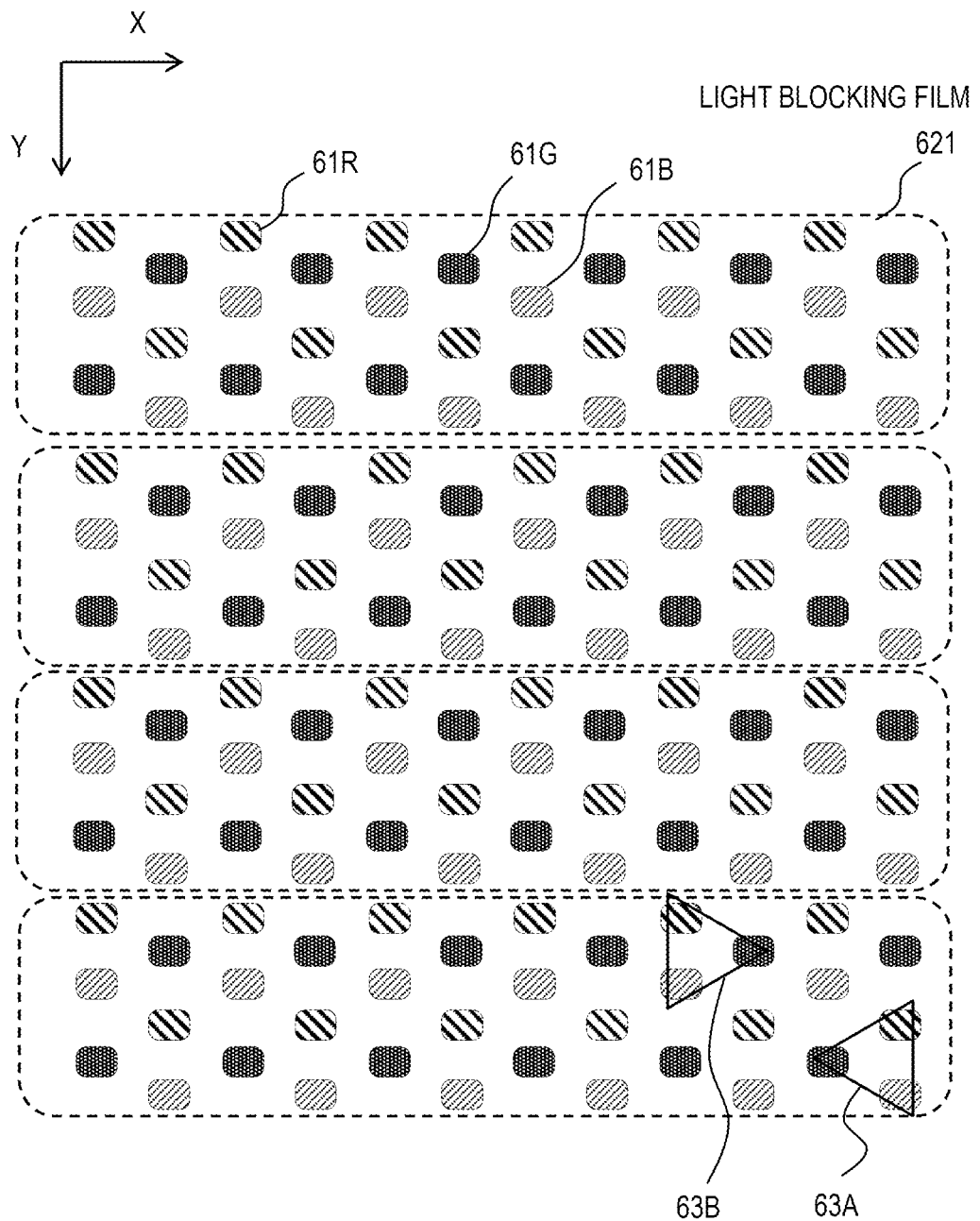
FIG. 6 illustrates a dummy pixel layout in another region surrounded by a dashed-dotted line in FIG. 4.

FIG. 6 illustrates a dummy pixel layout in the region 461 surrounded by a dashed-dotted line in FIG. 4. The region 461 includes a part of the dummy pixels disposed outside the display region 125. FIG. 6 includes a plurality of red dummy subpixels 61R, a plurality of blue dummy subpixels 61B, and a plurality of green dummy subpixels 61G. One of the red dummy subpixels, one of the blue dummy subpixels, and one of the green dummy subpixels are provided with reference signs 61R, 61B, and 61G, respectively, by way of example.

In the layout example in FIG. 6, two kinds of main pixels, namely first dummy main pixels 63A and second dummy main pixels 63B, are disposed in a matrix. In FIG. 6, one of the first dummy main pixels and one of the second dummy main pixels are provided with reference signs 63A and 63B, respectively. The first dummy main pixels 63A have the same configuration as the first main pixels 53A in the normal region 451 and the second dummy main pixels 63B have the same configuration as the second main pixels 53B in the normal region 451.

Each red dummy subpixel 61R is associated with one red subpixel 51R in the low-density region 453. In an example, the OLED elements of the red dummy subpixels 61R and the red subpixel 51R have the same size and the same structure. Different red dummy subpixels 61R are associated with different red subpixels 51R in the low-density region 453.

Each blue dummy subpixel 61B is associated with one blue subpixel 51B in the low-density region 453. In an example, the OLED elements of the blue dummy subpixels 61B and the blue subpixel 51B have the same size and the same structure. Different blue dummy subpixels 61B are associated with different blue subpixels 51B in the low-density region 453.

Each green dummy subpixel 61G is associated with one green subpixel 51G in the low-density region 453. In an example, the OLED elements of the green dummy subpixels 61G and the green subpixel 51G have the same size and the same structure. Different green dummy subpixels 61G are associated with different green subpixels 51G in the low-density region 453.

In the example in FIG. 6, each first dummy main pixel 63A is associated with one main pixel 53C in the low-density region 453. In similar, each second dummy main pixel 63B is associated with one main pixel 53C in the low-density region 453. Different first dummy main pixels 63A and second dummy main pixels 63B are associated with different main pixels 53C in the low-density region 453.

A dummy main pixel and the associated display main pixel in the low-density region 453 are supplied with the same data signal. That is to say, a dummy subpixel is controlled to be supplied with the same data signal as the associated display subpixel in the low-density region 453 to light at the same brightness as the associated display subpixel. As a result, the deterioration of the display subpixel can be estimated correctly by measuring the deterioration of the associated dummy subpixel.

Each row in the example of FIG. 6 includes six red, blue, or green dummy subpixels. The measured values of deterioration of these six dummy pixels are averaged to be used in estimation of the deterioration of the associated display main pixels in the low-density region 453. Using a plurality of dummy subpixels minimizes the error in the estimation caused by variations in manufacture, achieving more accurate compensation for the deterioration. Regarding the number of dummy subpixels, at least one set of a red subpixel, a blue subpixel, and a green subpixel will work; the optimum number of dummy pixels is determined in consideration of the balance between the area allowing disposition of dummy pixels and the required accuracy in deterioration compensation.

FIG. 6 includes a plurality of opaque light blocking films 621 separate from one another. In FIG. 6, one of the light blocking films represented by rounded rectangles in dashed lines is provided with a reference sign 621 by way of example. Providing a plurality of light blocking films 621 makes the size of each light blocking film smaller. As a result, unfavorable effect on touch detection with a touch screen 333 can be reduced. Especially, it is effective in the case where the light blocking films 621 are provided on the same layer as the metallic films for touch electrodes of the touch screen.

The plurality of light blocking films 621 are disposed to cover the plurality of dummy subpixels on the side to be viewed. The light blocking films 621 block light from the subpixels thereunder not to be seen by the user. Although FIG. 6 illustrates the light blocking films 621 covering a part of the dummy subpixels on the left when viewed from the user, all dummy pixels on both sides are covered with light blocking films 621.

Each light blocking film 621 can cover any number (including one) of subpixels. Although the light blocking films 621 in the example of FIG. 6 are provided on the same layer (made of the same material by the same process), one or more of the light blocking films 621 can be on a layer different from the other light blocking films 621. The shapes of the light blocking films 621 are not limited to the one in the example in FIG. 6 and can be determined desirably; different light blocking films 621 can have different shapes. On one or both sides of the display region 125, all dummy subpixels can be covered with a single light blocking film 621.

In a dummy subpixel column extending along the Y-axis in the example of FIG. 6, red dummy subpixels 61R, blue dummy subpixels 61B, and green dummy subpixels 61G are disposed cyclically, like in a subpixel column in the normal region 451. In an example, the dummy subpixels in a dummy subpixel column are connected with the same data line. A dummy subpixel row is composed of dummy subpixels of the same color at the same Y-axial position aligned along the X-axis. In an example, the dummy subpixels in a dummy subpixel row are connected with the same scanning line.

The layout pattern of the dummy subpixels can be different from the layout pattern of the subpixels in the normal region 451. For example, the subpixels constituting a dummy main pixel associated with a display main pixel do not have to be adjacent to one another but can be distant from one another with another subpixel interposed therebetween. In another example, the layouts of dummy subpixels on both sides of the display region 125 can be either identical or different; the number of dummy subpixels can be either equal or different. The locations of the dummy subpixels are not limited specifically as far as they are outside the display region 125.

Layout of Light Blocking Patterns

Figure 7:
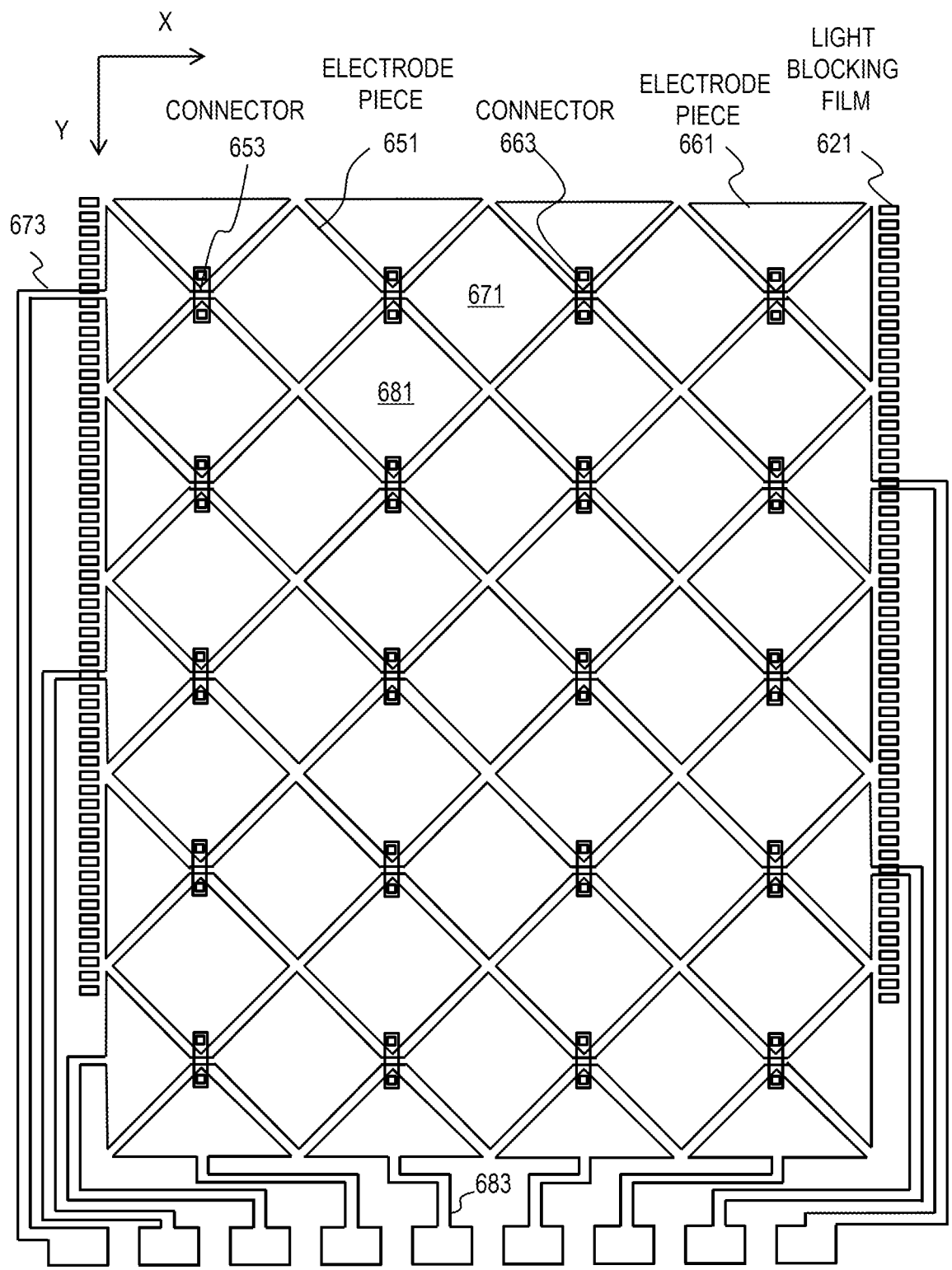
FIG. 7 is a plan diagram illustrating an example of a light blocking film pattern and a touch electrode pattern formed on a touch screen.

FIG. 7 is a plan diagram illustrating an example of a light blocking film pattern and a touch electrode pattern formed on a touch screen 333. The electrode pattern illustrated in FIG. 7 is for a projected capacitive touch screen. The touch screen 333 includes X touch electrodes 671 extending along the X-axis and disposed one above another along the Y-axis and Y touch electrodes 681 extending along the Y-axis and disposed side by side along the X-axis. In FIG. 7, one of the X touch electrodes and one of the Y touch electrodes are provided with reference signs 671 and 681, respectively, by way of example.

Each X touch electrode 671 is composed of rhombic or triangular electrode pieces 651 disposed along the X-axis and rectangular connectors 653 for connecting corners of electrode pieces 651 adjacent to each other. The connectors 653 are narrower than the electrode pieces 651. The electrode pieces 651 and the connectors 653 are made of a transparent conductor such as ITO. An X touch electrode 671 is made of an unseparated transparent conductor; its electrode pieces 651 and connectors 653 are included in the same layer.

Each Y touch electrode 681 is composed of rhombic or triangular electrode pieces 661 disposed along the Y-axis and rectangular connectors 663 for connecting corners of electrode pieces 661 adjacent to each other. The connectors 663 are narrower than the electrode pieces 661. The electrode pieces 661 are made of a transparent conductor such as ITO or IZO. In the example of FIG. 7, the electrode pieces 661 are included in the same layer as the X touch electrodes 671. The connectors 663 are provided on a layer upper than the electrode pieces 661 and made of a conductor (metal) having a light blocking property. The connectors 663 can be made of Al or Mo.

The electrode pieces 651 of the X touch electrodes 671 and the electrode pieces 661 of the Y touch electrodes 681 are disposed in a matrix. The driver IC 134 or a not-shown detector circuit detects a capacitive change between an X touch electrode 671 and a Y touch electrode 681 caused by a pointer such as a finger or a touch pen approaching the touch screen 333 through lines 673 and 683. The touch point is located through this operation.

The connectors 663 of the Y touch electrodes 681 are disposed to intersect with the connectors 653 of the X touch electrodes 671 when viewed planarly. An insulating layer (not shown) is provided between the layer of the connectors 663 and the layer of the X touch electrodes 671. An insulating film is interposed between a connector 663 and a connector 653 at their intersection to maintain their electrical isolation.

The touch screen 333 further includes a light blocking film pattern composed of a plurality of light blocking films 621. The light blocking films 621 are disposed outside the touch detection region where the touch electrodes 671 and 681 are disposed. As described above, the light blocking films 621 are made of light blocking material; in the example of FIG. 7, they are on the same layer as the connectors 663 of the Y touch electrodes 681, that is to say, they are made of a metal having a light blocking property. Forming the light blocking films 621 on the same layer as the light blocking elements of the touch screen 333 improves the efficiency in manufacturing the display device. Providing a plurality of light blocking films 621 makes the size of one light blocking film smaller, achieving less unfavorable effect on touch detection.

The configuration example in FIG. 7 includes columns of light blocking films on both sides of the touch detection region. The number of columns and the number of light blocking films per column can be selected desirably. As described above, the light blocking films 621 are aligned to cover the dummy subpixels. The pattern of the light blocking films 621 is also determined desirably; for example, the patterns (the number and the shape) of light blocking films 621 on both sides of the touch detection region can be different. The light blocking films 621 can be provided on another layer including a light blocking element of the touch screen 333 different from the touch electrodes or a layer other than the touch screen 333. Any sensing method can be selected for the touch screen 333 and moreover, the touch screen 333 does not have to be included.

Wiring Layout

Figure 8:
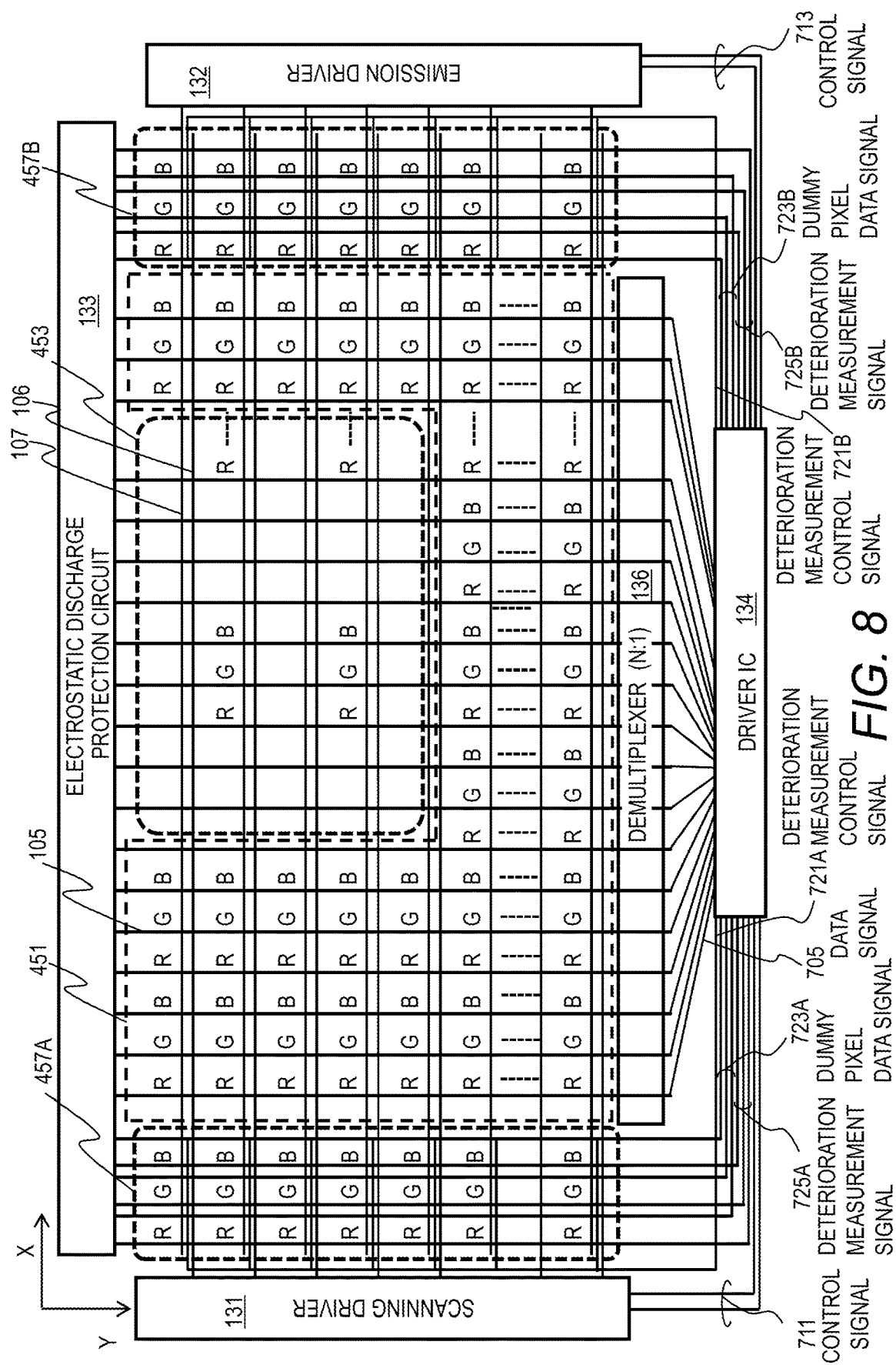
FIG. 8 schematically illustrates a layout of control lines on the TFT substrate.

Hereinafter, an example of the wiring layout of the OLED display device 10 is described. FIG. 8 schematically illustrates a layout of control lines on the TFT substrate 100. The layout of pixel circuits in the normal region 451 in the configuration example of FIG. 8 is stripe arrangement. Specifically, each subpixel column extending along the Y-axis is composed of subpixels of the same color. Each subpixel row extending along the X-axis is composed of red subpixels, green subpixels, and blue subpixels disposed cyclically. The low-density region 453 has a configuration such that some pixels are removed from the pixel layout of the normal region 451. The blank area in the low-density region 453 does not include any pixel circuit including an OLED element but includes only lines.

Dummy pixel regions 457A and 457B are provided on both sides of the display region 125. Although the configuration example in FIG. 8 includes one red dummy subpixel column, one green dummy subpixel column, and one blue dummy subpixel column in each of the dummy pixel regions 457A and 457B, two each or more of dummy subpixel columns can be included for more accurate deterioration compensation.

A plurality of scanning lines 106 extend along the X-axis from the scanning driver 131. A plurality of emission control lines 107 extend along the X-axis from the emission driver 132. In FIG. 8, one of the scanning lines and one of the emission control lines are provided with reference signs 106 and 107, respectively.

A scanning line 106 in the configuration example of FIG. 8 transmits a selection signal for not only the normal region 451 and the low-density region 453 but also the dummy pixel regions 457A and 457B. Connecting dummy subpixels with the same scanning line 106 connected with subpixels in the display region 125 achieves a smaller number of lines.

An emission control line 107 transmits an emission control signal for not only the normal region 451 and the low-density region 453 but also the dummy pixel regions 457A and 457B. Connecting dummy subpixels with the same emission control line 107 connected with subpixels in the display region 125 achieves a smaller number of lines.

The driver IC 134 sends a control signal for the scanning driver 131 through lines 711 and a control signal for the emission driver 132 through lines 713. The driver IC 134 controls the timing of the scanning signal (selection pulses) from the scanning driver 131 and the emission control signal from the emission driver 132, based on image data (an image signal) from the external.

The driver IC 134 supplies data signals for the subpixels in the normal region 451 and the low-density region 453 to the demultiplexer 136 through lines 705. In FIG. 8, one of the lines is provided with a reference sign 705 by way of example. The driver IC 134 determines data signals for individual subpixels in the normal region 451 and the low-density region 453. The data signal for one subpixel is determined from grayscale levels of one or more subpixels of image data (for one frame) from the external. The demultiplexer 136 outputs one output of the driver IC 134 to N data lines (N is an integer greater than 1) in series within a scanning period. In FIG. 8, one of the plurality of data lines extending along the Y-axis is provided with a reference sign 105, by way of example.

The driver IC 134 further supplies data signals for the dummy subpixels in the dummy pixel region 457A through a plurality of lines 723A. The driver IC 134 supplies data signals for the dummy subpixels in the dummy pixel region 457B through a plurality of lines 723B. The dummy subpixels to be supplied with data signals transmitted by one line 723A are selected by different scanning lines 106. The dummy subpixels to be supplied with data signals transmitted by one line 723B are selected by different scanning lines 106.

The driver IC 134 sends a control signal for deterioration measurement to the dummy pixel region 457A through a line 721A and sends a control signal for deterioration measurement to the dummy pixel region 457B through a line 721B. The line 721A is connected with all dummy subpixels in the dummy pixel region 457A. The line 721B is connected with all dummy subpixels in the dummy pixel region 457B. The details of the control signal for deterioration measurement will be described later.

The driver IC 134 receives deterioration measurement signals of the dummy subpixels in the dummy pixel region 457A through a plurality of lines 725A. In the configuration example in FIG. 8, the dummy subpixels whose deterioration measurement signals are transmitted by one line 725A are selected by different scanning lines 106. In the example of FIG. 8, each group of dummy subpixels connected with one line 725A corresponds to each group of dummy subpixels connected with one line 723A for transmitting data signals.

The driver IC 134 receives deterioration measurement signals of the dummy subpixels in the dummy pixel region 457B through a plurality of lines 725B. In the configuration example in FIG. 8, the dummy subpixels whose deterioration measurement signals are transmitted by one line 725B are selected by different scanning lines 106. The details of the method of measuring deterioration of dummy pixels will be described later.

Figure 9:
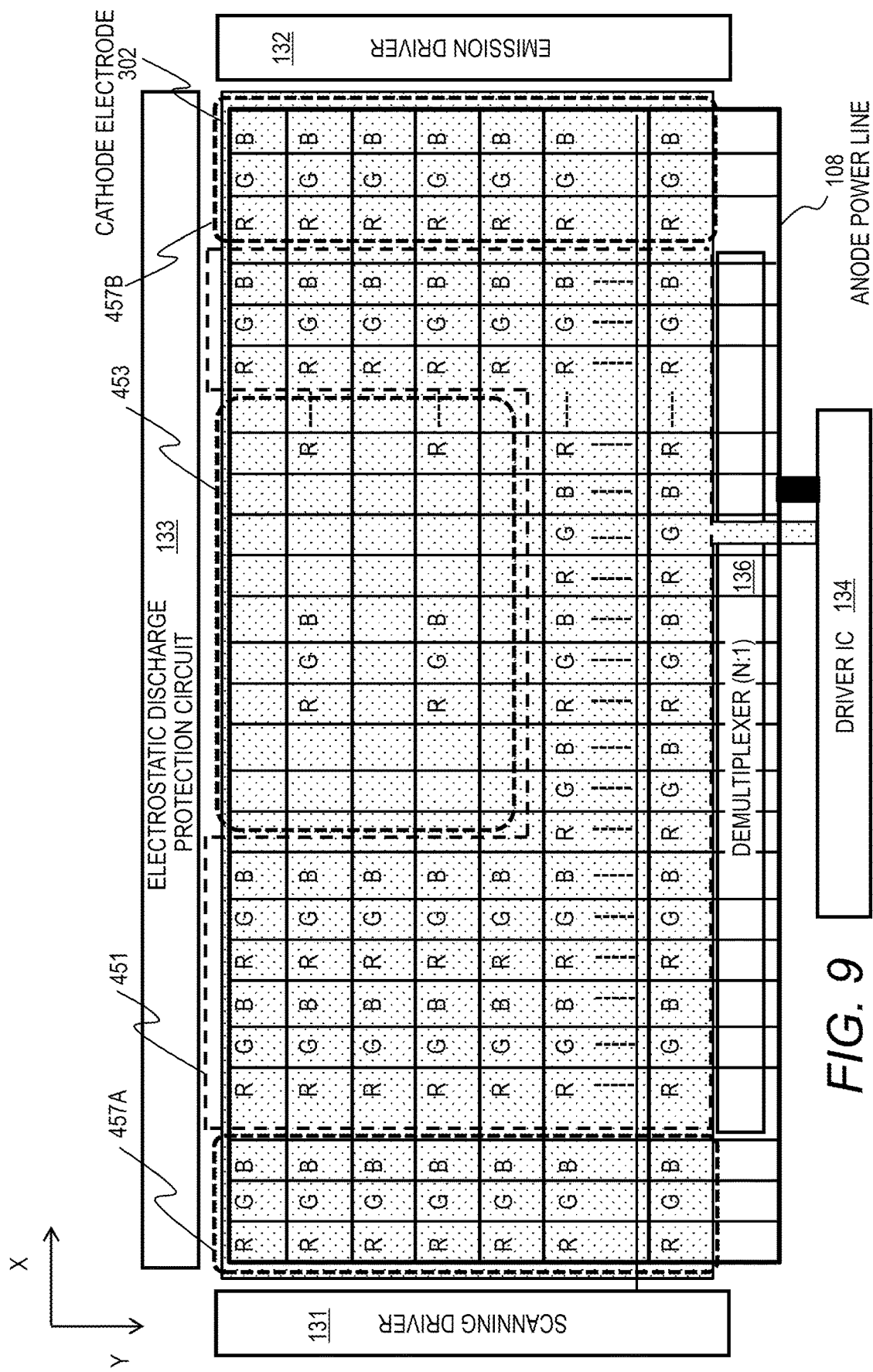
FIG. 9 schematically illustrates a layout of an anode power line and a cathode electrode on the TFT substrate.

FIG. 9 schematically illustrates a layout of an anode power line and a cathode electrode on the TFT substrate 100. The driver IC 134 includes a DC-DC converter; the driver IC 134 generates a plurality of different power supply potentials to supply them to the OLED display panel. The driver IC 134 in the configuration example of FIG. 9 outputs an anode power supply potential VDD to the anode power line 108 and a cathode power supply potential VSS to the cathode electrode 302.

The anode power line 108 is spread like a mesh to transmit the anode power supply potential VDD to each subpixel in the normal region 451, the low-density region 453, and the dummy pixel regions 457A and 457B. The cathode electrode 302 has a sheet-like shape that fully covers the normal region 451, the low-density region 453, and the dummy pixel regions 457A and 457B. The cathode electrode of each subpixel in these regions 451, 453, 457A, and 457B is a part of the sheet-like cathode electrode 302.

Light Emission Control Method

Figure 10:
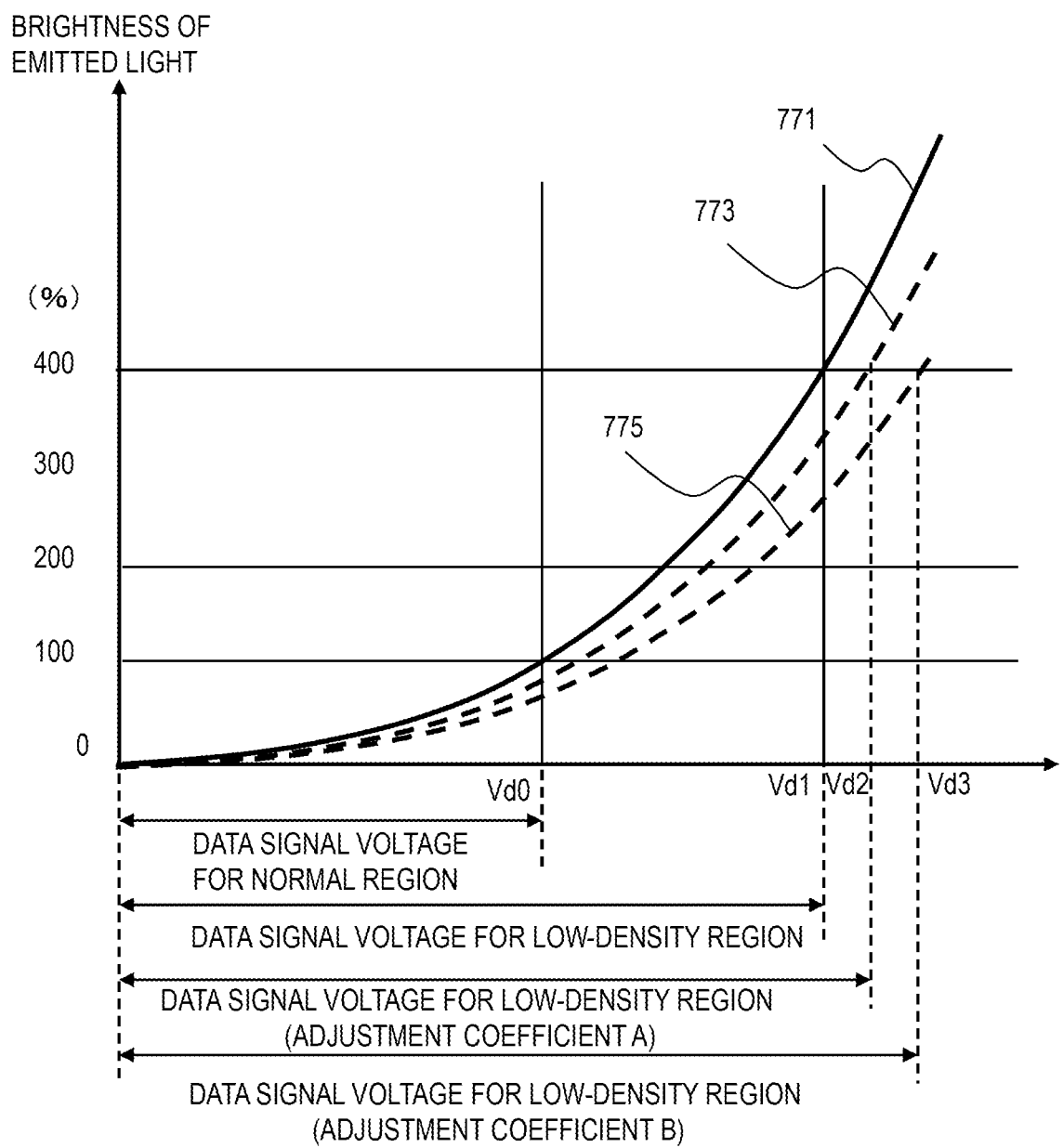
FIG. 10 is a graph schematically illustrating relations between the data signal voltage for the subpixels in the normal region and the low-density region and the brightness of light emitted from their OLED elements.

Hereinafter, a light emission control method for the subpixels of the OLED display device 10 is described. The driver IC 134 controls the brightness of light to be emitted from individual subpixels in the normal region 451, the low-density region 453, and the dummy pixel regions 457A and 457B. FIG. 10 is a graph schematically illustrating relations between the data signal voltage (also simply referred to as data signal) for the subpixels in the normal region 451 and the low-density region 453 and the brightness of the light emitted from their OLED elements.

The curve 771 in the graph of FIG. 10 represents the characteristic of a subpixel in the normal region 451 and an undeteriorated subpixel in the low-density region 453. For the grayscale level for white, a data signal voltage Vd0 is supplied to the subpixel in the normal region 451 and a data signal voltage Vd1 is supplied to the subpixel in the low-density region 453. In this example, the subpixel in the low-density region 453 lights four times brighter than the subpixel in the normal region 451.

As the lighting time increases, the subpixel (OLED element) in the low-density region 453 deteriorates more than one order of magnitude faster than the subpixel in the normal region 451. Assume that the subpixel in the normal region 451 maintains its characteristic without deterioration and the subpixel in the low-density region 453 deteriorates with lighting time. Then, deterioration compensation sufficient for a display system can be achieved with a minimum circuit configuration.

The curve 773 in the graph of FIG. 10 represents the characteristic of a deteriorated subpixel in the low-density region 453. To light at the same brightness (400%) as before the deterioration, the subpixel in the low-density region 453 is supplied with a data signal voltage Vd2, which is higher than the data signal voltage Vd1. The data signal voltage Vd2 is calculated based on an adjustment coefficient A in accordance with the deterioration.

The curve 775 represents the characteristic of a more deteriorated subpixel in the low-density region 453. To light at the same brightness (400%) as before the deterioration, the subpixel in the low-density region 453 is supplied with a data signal voltage Vd3, which is higher than the data signal voltage Vd2. The data signal voltage Vd3 is calculated based on an adjustment coefficient B in accordance with the deterioration. As will be described later, the adjustment coefficients A and B are determined based on the measurement results on the deterioration of the dummy subpixel.

The subpixel in the normal region 451 deteriorates slowly, compared to the subpixel in the low-density region 453. Accordingly, the driver IC 134 can output a data signal for the subpixel in the normal region 451 without adjustment depending on the deterioration of the subpixel. In another example, the driver IC 134 can adjust a data signal for the subpixel in the normal region 451 depending on the deterioration. Since no dummy subpixel associated with a subpixel in the normal region 451 is prepared, the driver IC 134 can hold the history of data signals for the subpixel and determine an adjustment coefficient to meet the history with reference to a predetermined lookup table.

Figure 11:
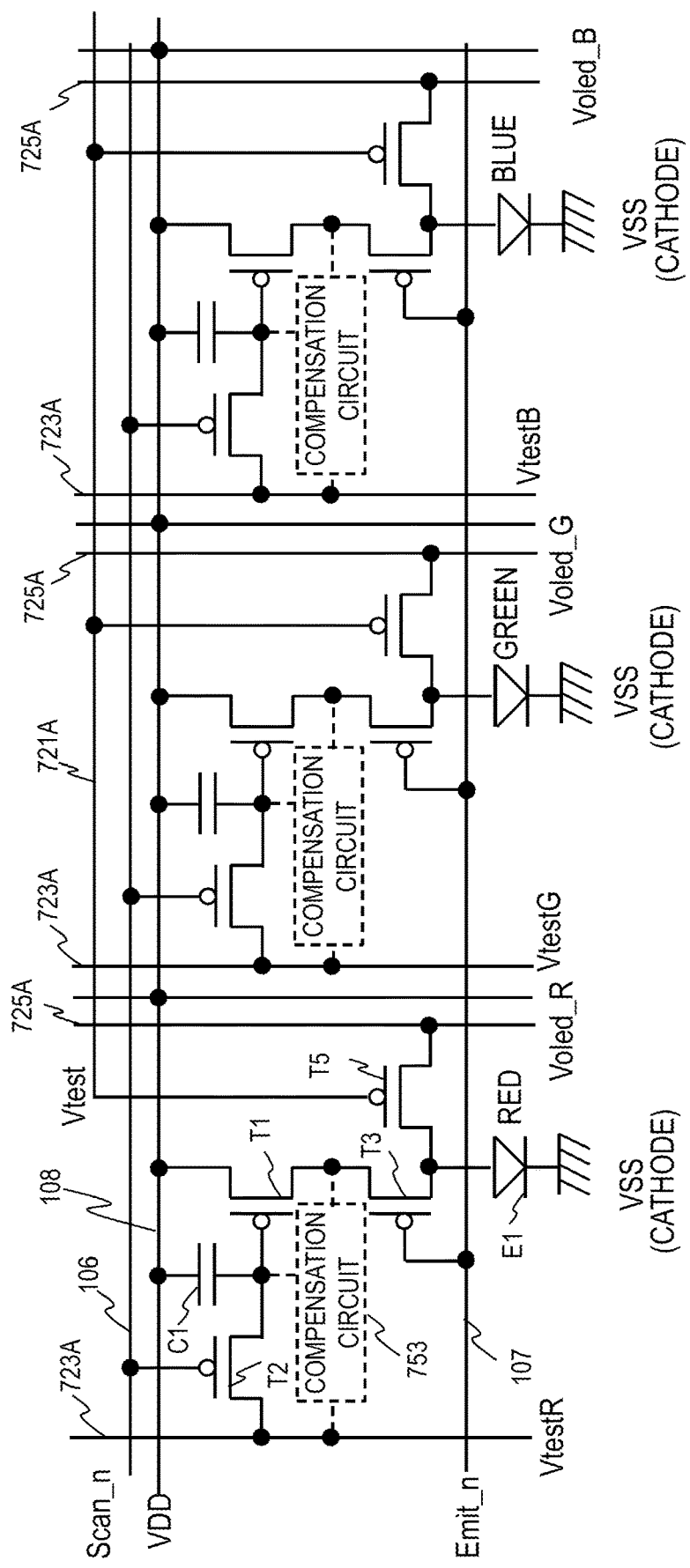
FIG. 11 illustrates a configuration example of the pixel circuits of dummy subpixels.

Next, a method of controlling dummy subpixels is described. FIG. 11 illustrates a configuration example of the pixel circuits of dummy subpixels. FIG. 11 illustrates the pixel circuits of a red subpixel, a green subpixel, and a blue subpixel in the n-th row. The pixel circuits of all dummy subpixels are identical, except for the color of the OLED elements. The scanning line 106 transmits a scanning signal Scan_n to the three dummy subpixels simultaneously. The emission control line 107 transmits an emission control signal Emit_n to the three dummy subpixels simultaneously.

Three different lines 723A transmit data signals VtestR, VtestG, and VtestB to the pixel circuits of the red dummy subpixel, the green dummy subpixel, and the blue dummy subpixel, respectively. The line 721A transmits a deterioration measurement control signal Vtest to the pixel circuits of the three dummy subpixels simultaneously. Three different lines 725A transmit deterioration measurement signals Voled_R, Voled_G, and Voled_B of the red, green, and blue dummy subpixels to the driver IC 134.

Next, the configuration of the pixel circuits of dummy subpixels is described. The pixel circuit configuration is common to the different colors of dummy subpixels. In FIG. 11, the constituents of the pixel circuit of the red dummy subpixel are provided with reference signs by way of example. The configuration of the pixel circuit of the red dummy subpixel is described in the following. The pixel circuit in FIG. 11 has a configuration such that a switch transistor T5 and a threshold voltage compensation circuit 753 are added to the pixel circuit illustrated in FIG. 2A. The pixel circuit of a display subpixel in the display region 125 can have a configuration such that the switch transistor T5 is excluded from this pixel circuit of a dummy subpixel.

The threshold voltage compensation circuit 753 compensates for the variation in threshold voltage of the driving transistor T1. The switch transistor T5 is connected with the anode of the OLED element E1 and the line 725A. Specifically, either the source or the drain of the switch transistor T5 is connected with a node between the anode of the OLED element E1 and the transistor T3 and the remaining source or drain is connected with the line 725A. The gate of the switch transistor T5 is connected with the line 721A. The switch transistor T5 is controlled to be ON/OFF by the deterioration measurement control signal Vtest. The driver IC 134 maintains the switch transistor T5 to be OFF in normal operation and maintains the switch transistor T5 to be ON in measuring the deterioration of the OLED element E1.

Figure 12:
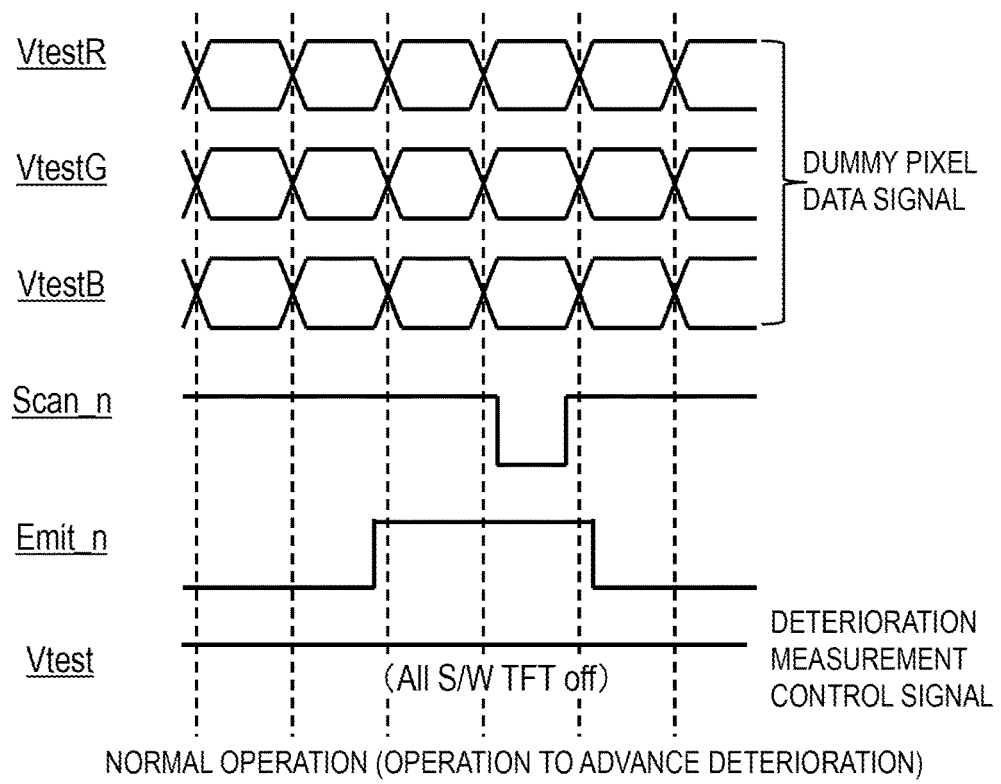
FIG. 12 is an example of a timing chart of signals for dummy subpixels in normal operation.

Next, emission control for the dummy subpixels in normal operation and deterioration measurement operation is described. FIG. 12 is an example of a timing chart of signals for dummy subpixels in normal operation. The signals are for the red, green, and blue dummy subpixels simultaneously selected to be controlled together. These dummy subpixels can constitute a dummy main pixel associated with a main pixel in the low-density region 453.

The signals VtestR, VtestG, and VtestB represent data signals to be supplied to a red dummy subpixel column, a green dummy subpixel column, and a blue dummy subpixel column, respectively. Assume that dummy subpixels of the same color are connected with one line 723A as illustrated in FIG. 8. The dummy pixel data signals VtestR, VtestG, and VtestB are at the values same as the data signals for the subpixels in the low-density region 453 associated with the dummy subpixels.

When the scanning signal Scan_n for selecting the n-th row is Low, the dummy subpixels in the n-th row are selected and the dummy pixel data signals VtestR, VtestG, and VtestB are written to the pixel circuits. When the data signals are being written, the emission control signal Emit_n is High and the transistors T3 are OFF. Accordingly, the OLED elements E1 do not emit light.

After the data signals have been written, the emission control signal Emit_n turns into Low and the OLED elements E1 emit light. As described above, the dummy subpixels are covered with light blocking films 621 on the side to be viewed, the light from the dummy subpixels do not affect the image displayed in the display region 125. In normal operation, the deterioration measurement control signal Vtest is always High and the switch transistors T5 of the pixel circuits of all dummy subpixels are maintained to be OFF.

Next, deterioration measurement operation for the OLED elements of dummy subpixels is described. In an example, the driver IC 134 measures the deterioration of the OLED elements of the dummy subpixels when the image based on image data from the external is not displayed (in a non-displaying period). The driver IC 134 can perform the measurement in a startup sequence from powering on of the OLED display device 10 until displaying an image in accordance with image data from the external or in a standby mode in which the power is on but displaying image is stopped, for example. The standby mode can be started when image data has not been input for a predetermined time.

Figure 13:
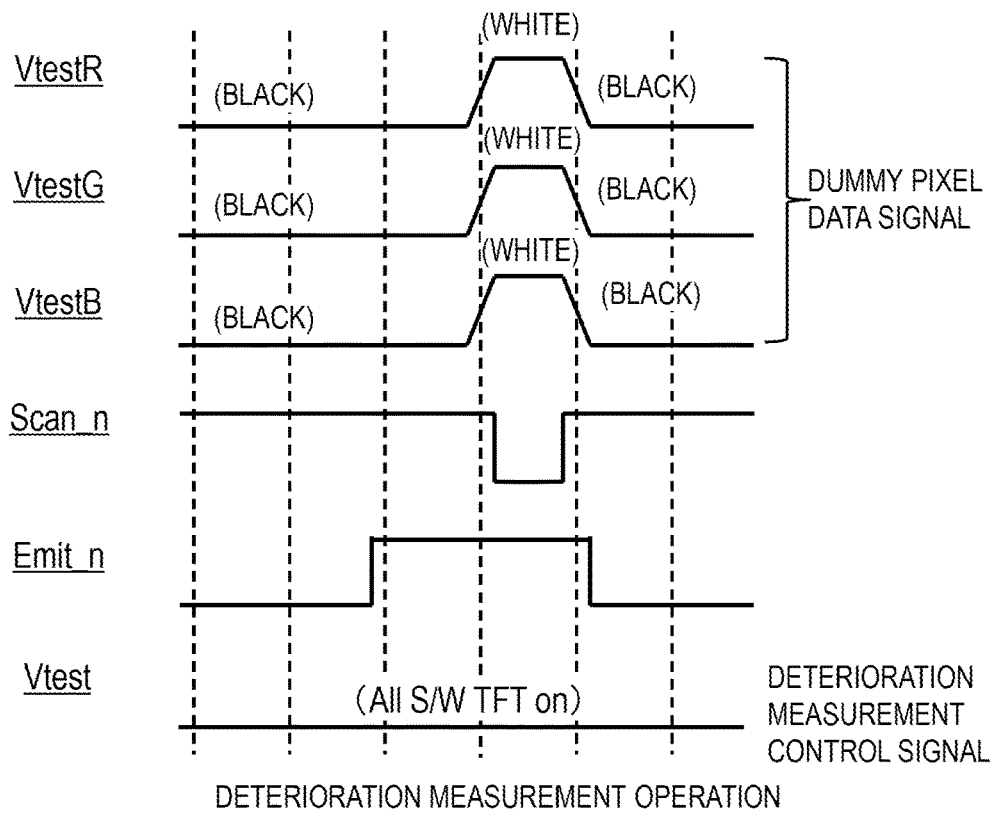
FIG. 13 is a timing chart of signals in deterioration measurement operation for the OLED elements of dummy subpixels.

FIG. 13 is a timing chart of signals in deterioration measurement operation for the OLED elements E1 of dummy subpixels. The measurement targets are the dummy subpixels in the n-th row. In performing measurement on a selected row in the deterioration measurement operation, the deterioration measurement control signal Vtest is Low and the switch transistors T5 in the pixel circuits of all dummy subpixels are maintained to be ON.

Among the dummy subpixels connected with a line 725A for transmitting the deterioration measurement signal, all dummy subpixels except for the target dummy subpixel are supplied with zero data signals. As a result, the other dummy subpixels stop lighting to improve the S/N ratio in deterioration measurement on the target dummy subpixel.

When the scanning signal Scan_n for selecting the n-th row is Low, the dummy subpixels in the n-th row are selected and the dummy pixel data signals VtestR, VtestG, and VtestB for deterioration measurement are written to the pixel circuits. In the example of FIG. 13, the data signals are for the highest brightness. This configuration achieves more accurate measurement of the deterioration of the OLED elements E1. The data signals in measuring the deterioration can be at different values.

When data signals for deterioration measurement are being written, the emission control signal Emit_n is High and the transistors T3 are OFF. After the data signals have been written, the emission control signal Emit_n changes to Low to light the OLED elements E1. The light from the OLED elements E1 is blocked by the light blocking films 621.

The driver IC 134 receives deterioration measurement signals Voled_R, Voled_G, and Voled_B of the dummy subpixels through the lines 725A. The deterioration measurement signals Voled_R, Voled_G, and Voled_B indicate the anode potentials of the corresponding OLED elements. The resistance of an OLED element increases as the OLED element deteriorates.

Accordingly, the resistance, namely the extent of deterioration, of an OLED element can be measured by measuring the voltage of the OLED element (the voltage across the anode and the cathode) while supplying a fixed current to the OLED element. The driver IC 134 performs A/D conversion on the potentials of the lines 725A and records the obtained values as the deterioration levels of the display subpixels associated with the dummy subpixels. Measuring the deterioration of an OLED element can employ a desirable method. For example, the extent of deterioration of an OLED element in FIG. 11 can be determined by directly measuring the current flowing into the OLED element with a current sensing amplifier while applying a fixed voltage to the OLED element under the condition that the driving transistor T1 operates linearly.

The driver IC 134 adjusts data signals for the subpixels in the low-density region 453 based on the deterioration measurement results on the associated dummy subpixels. For example, the driver IC 134 determines an adjustment coefficient for compensating for the deterioration of an OLED element with reference to a lookup table in which resistance values (deterioration levels) of dummy subpixels are associated with adjustment coefficients. The deterioration of subpixels in the low-density region 453 that progresses fast can be estimated accurately by measuring the deterioration of dummy pixels that have lit in accordance with the same data signal patterns as the subpixels in the low-density region 453, enabling appropriately maintaining the display quality of the OLED display device 10.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a display region including a plurality of display pixels, the display region being configured to display an image in accordance with image data input from an external device;
   a plurality of dummy pixels disposed outside the display region;
   one or more light blocking films covering the plurality of dummy pixels on the side to be viewed; and
   a control circuit configured to control the display region and the plurality of dummy pixels,
   wherein the display region includes:
      a first region, and
      a second region having a lower display pixel density than the first region,
   wherein a number of display pixels in the second region is the same as a number of the plurality of dummy pixels and the display pixels disposed in the second region are associated with the plurality of dummy pixels,
   wherein each of the plurality of display pixels and the plurality of dummy pixels includes a light-emitting element that emits light in response to driving current,
   wherein each of the plurality of dummy pixels and the associated display pixel in the second region include light-emitting elements of a same color, and
   wherein the control circuit is configured to:
      supply the display pixels in the second region with driving current higher than driving current for the display pixels in the first region for a same grayscale level specified in image data,
      in a normal operation, supply each of the plurality of dummy pixels with a same emission current as an emission current of the image data for the associated display pixel in the second region,
      in a deterioration measurement operation, supply each of the plurality of dummy pixels with an emission current for deterioration measurement independent of supply of the emission current of the image data for the associated display pixel in the second region to determine a resistance value of the light-emitting element of each of the plurality of dummy pixels by measuring current flowing through the light-emitting element while applying a fixed voltage to the light-emitting element or measuring voltage of the light-emitting element while supplying a fixed current to the light-emitting element, the resistance value representing deterioration of the light-emitting element of each of the plurality of dummy pixels, and
      adjust data signals for the display pixels in the second region associated with the plurality of dummy pixels based on results of the resistance value.

2. The display device according to claim 1, further comprising a touch screen disposed on the side to be viewed of the display region,
   wherein the touch screen includes light blocking conductive films connecting transparent electrode pieces, and
   wherein the one or more light blocking films are located on a same layer as the light blocking conductive films.

3. The display device according to claim 1,
   wherein the display device comprises a plurality of light blocking films, and
   wherein each of the plurality of light blocking films covers one or more of the plurality of dummy pixels on the side to be viewed.

4. The display device according to claim 1, wherein each of the plurality of dummy pixels is connected with a scanning line configured to select a display pixel row in the display region.

5. The display device according to claim 1, wherein the control circuit is configured to measure deterioration of the light-emitting elements of one or more dummy pixels while stopping light emission of all dummy pixels other than the one or more dummy pixels of measurement targets.

6. The display device according to claim 1, wherein the control circuit is configured to measure deterioration of the light-emitting elements of one or more dummy pixels while supplying the one or more dummy pixels of measurement targets with data signals specifying a highest brightness.

7. A terminal device comprising:
   the display device according to claim 1; and
   one or more cameras disposed under the second region.

\* \* \* \* \*